(12) United States Patent
Ning et al.

(10) Patent No.: US 8,450,850 B2
(45) Date of Patent: May 28, 2013

(54) THIN-FILM TRANSISTOR SUBSTRATE AND METHOD OF MANUFACTURING THE SAME

(75) Inventors: Hong Long Ning, Suwon-si (KR); Chang-Oh Jeong, Suwon-si (KR); Ji-Young Park, Hwaseong-si (KR); Sang-Gab Kim, Seoul (KR); Sung-Haeng Cho, Cheonan-si (KR); Yeon-Hong Kim, Yongin-si (KR); Jin-Su Byun, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 60 days.

(21) Appl. No.: 13/193,413

(22) Filed: Jul. 28, 2011

(65) Prior Publication Data

US 2012/0112346 A1 May 10, 2012

(30) Foreign Application Priority Data

Nov. 4, 2010 (KR) .................. 10-2010-0109166

(51) Int. Cl.
*H01L 23/52* (2006.01)
(52) U.S. Cl.
USPC .................. 257/746; 257/774; 257/E23.165; 257/E21.578; 438/161; 438/610; 438/637
(58) Field of Classification Search
USPC .................. 257/746, 774, E23.165, E21.578, 257/773, 776; 977/952, 843; 438/637, 674, 438/675, 610, 161
See application file for complete search history.

(56) References Cited

U.S. PATENT DOCUMENTS

| 6,429,916 | B1 * | 8/2002 | Nakata et al. | ................. 349/106 |
| 2006/0226441 | A1 * | 10/2006 | Seo et al. | ...................... 257/190 |
| 2008/0224128 | A1 * | 9/2008 | Kim et al. | ........................ 257/40 |
| 2008/0299693 | A1 * | 12/2008 | Toyota et al. | .................... 438/34 |

\* cited by examiner

*Primary Examiner* — Jasmine Clark
(74) *Attorney, Agent, or Firm* — Innovation Counsel LLP

(57) ABSTRACT

Provided are a thin-film transistor (TFT) substrate and a method of manufacturing the same. The method includes: forming a passivation film by forming an insulating film on a substrate; forming a photoresist pattern by forming a photoresist film on the passivation film, exposing the photoresist film to light, and developing the photoresist film; performing a first dry-etching by dry-etching the passivation film using the photoresist pattern as an etch mask; performing a baking to reduce a size of the photoresist pattern; performing a second dry-etching to form a contact hole by dry-etching the passivation film again using the photoresist pattern as a mask; removing the photoresist pattern; and forming a pixel electrode of a carbon composition that includes carbon nanotubes and/or graphene on a top surface of the passivation film.

15 Claims, 9 Drawing Sheets

THIN-FILM TRANSISTOR SUBSTRATE AND METHOD OF MANUFACTURING THE SAME

This application claims priority from Korean Patent Application No. 10-2010-0109166 filed on Nov. 4, 2010 in the Korean Intellectual Property Office, the disclosure of which is incorporated herein by reference in its entirety.

BACKGROUND OF THE INVENTION

1. Field of the Invention

The present invention relates to a thin-film transistor (TFT) substrate including pixel electrodes which are made of carbon nanotubes or graphene, and a method of manufacturing the TFT substrate.

2. Description of the Related Art

Liquid crystal displays (LCDs) are one of the most widely used types of flat panel displays (FPDs). Generally, an LCD includes two substrates, which each have electrodes, and a liquid crystal layer interposed between the substrates. Voltages are applied to the electrodes to rearrange liquid crystal molecules in the liquid crystal layer, thereby controlling the amount of light that passes through the liquid crystal layer.

The most commonly used type of LCDs at present include two substrates, each having electric field generating electrodes. On one of the two substrates, a plurality of pixel electrodes are arranged in a matrix pattern. On the other substrate, one common electrode covers the entire surface of the substrate. These electric field generating electrodes are usually formed of indium tin oxide (ITO) or indium zinc oxide (IZO) by a sputtering method. However, ITO and IZO are increasingly becoming more expensive due to an increase in the consumption of indium. In addition, forming an electrode using ITO or IZO involves high-priced equipment, a complicated process, and a long process time.

In this regard, attempts have been made to replace ITO or IZO as the material used to form electric field generating electrodes with carbon nanotubes or graphene. However, despite their low cost, stable conductivity, and high transmittance, film uniformity is difficult to ensure when using carbon nanotubes or graphene on a thin-film transistor (TFT) substrate, and thus contact resistance is increased.

SUMMARY OF THE INVENTION

A thin-film transistor (TFT) substrate which includes electrodes formed of carbon nanotubes and/or graphene and has a small contact resistance is provided.

A method of manufacturing a TFT substrate which includes electrodes formed of carbon nanotubes or graphene and has a small contact resistance is also provided.

According to one aspect, there is provided a TFT substrate including: an insulating substrate, a passivation film formed on the insulating substrate and having a contact hole which exposes a portion of a drain electrode, and a pixel electrode connected to the drain electrode by the contact hole and formed of a carbon composition including at least one of carbon nanotubes or graphene on the passivation film, wherein the contact hole is completely filled with the carbon composition.

According to another aspect, there is provided a TFT substrate including, an insulating substrate, a passivation film formed on the insulating substrate and having a contact hole which exposes a portion of a drain electrode, and a pixel electrode connected to the drain electrode by the contact hole and formed of a carbon composition including at least one of carbon nanotubes or graphene on the passivation film, wherein the passivation film has a thickness of 1000 Å or less.

According to another aspect, there is provided a method of manufacturing a TFT substrate. The method includes: forming a passivation film by forming an insulating film on a substrate, forming a contact hole which exposes a portion of a drain electrode by patterning the passivation film, and forming a pixel electrode of a carbon composition including at least one of carbon nanotubes or graphene on the passivation film while completely filling the contact hole with the carbon composition.

According to another aspect, there is provided a method of manufacturing a TFT substrate. The method includes: forming a passivation film by forming an insulating film on a substrate, forming a photoresist pattern by forming a photoresist film on the passivation film, exposing the photoresist film to light, and developing the photoresist film, performing a first dry-etching by dry-etching the passivation film using the photoresist pattern as an etch mask, performing a baking to reduce a size of the photoresist pattern by leaving the substrate at a predetermined temperature in the presence of a gas after the performing of the first dry-etching, performing a second dry-etching to form a contact hole by dry-etching the passivation film again using the photoresist pattern as a mask after the performing of the baking, removing the photoresist pattern after the performing of the second dry-etching, and forming a pixel electrode of a carbon composition including at least one of carbon nanotubes or graphene on a top surface of the passivation film.

BRIEF DESCRIPTION OF THE DRAWINGS

The above and other aspects and features will become more apparent by describing in detail exemplary embodiments thereof with reference to the attached drawings, in which.

DETAILED DESCRIPTION OF THE INVENTION

Figure 1:
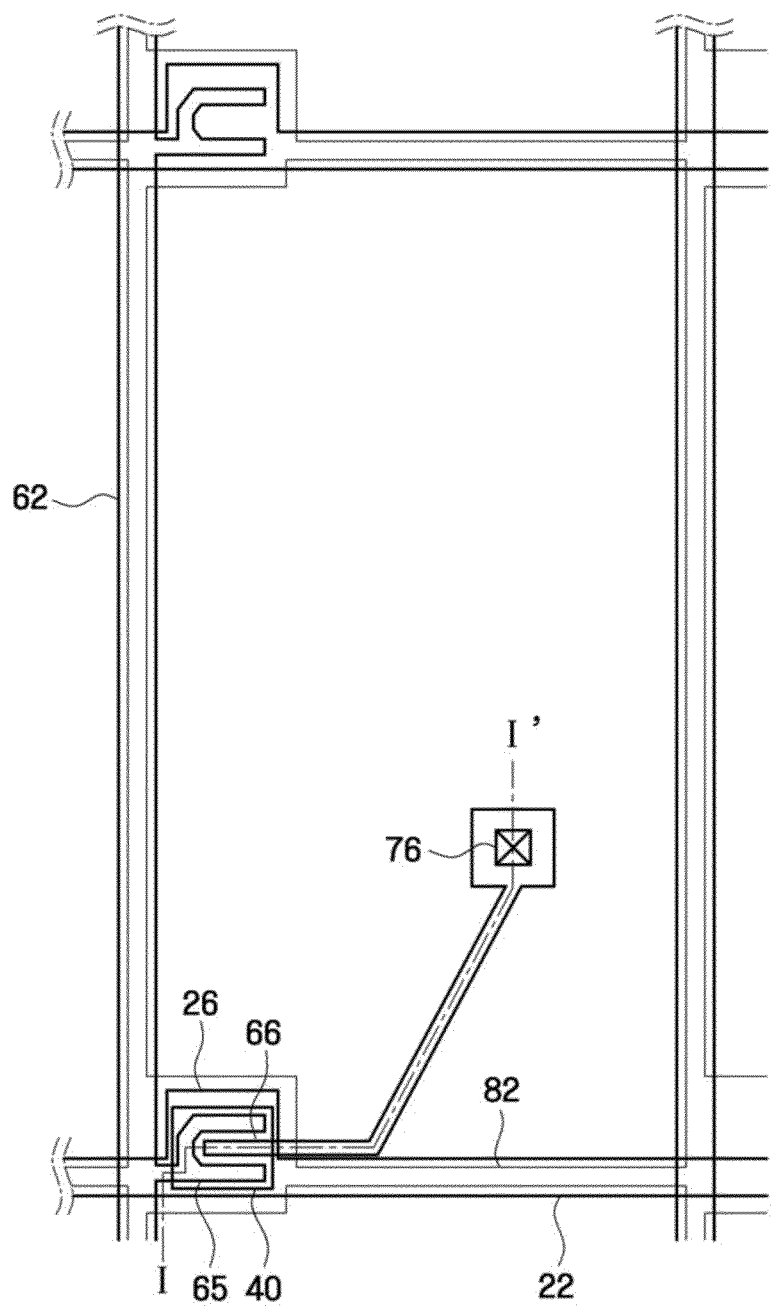
FIG. 1 is a plan view of a thin-film transistor (TFT) substrate according to an exemplary embodiment.

Advantages and features of the present disclosure and methods of accomplishing the same may be understood more readily by reference to the following detailed description of exemplary embodiments and the accompanying drawings. The present invention may, however, be embodied in many different forms and should not be construed as being limited to the embodiments set forth herein. In the drawings, sizes and relative sizes of layers and regions may be exaggerated for clarity.

It will be understood that when an element or layer is referred to as being "on" another element or layer, the element or layer can be directly on another element or layer, or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to plan and cross-section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, exemplary embodiments will be described in further detail with reference to the accompanying drawings.

Figure 2:
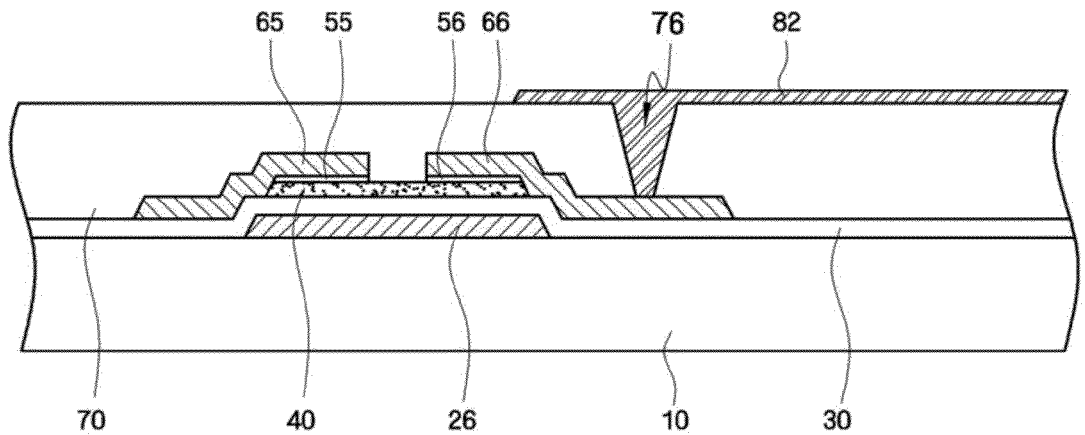
FIG. 2 is a cross-sectional view of the TFT substrate taken along line I-I' of FIG. 1.

A thin-film transistor (TFT) substrate according to an exemplary embodiment will now be described with reference to FIGS. 1 and 2. FIG. 1 is a plan view of a TFT substrate according to an exemplary embodiment. FIG. 2 is a cross-sectional view of the TFT substrate taken along line I-I' of FIG. 1.

Referring to FIGS. 1 and 2, the TFT substrate according to the current exemplary embodiment includes an insulating substrate 10, a gate electrode 26, a gate insulating film 30, a semiconductor layer 40, ohmic contact layers 55 and 56, a source electrode 65, a drain electrode 66, a passivation film 70, and a pixel electrode 82.

The insulating substrate 10 is made of a transparent insulating material such as glass or plastic. A gate line 22 extending in a first direction, for example, a horizontal direction and transmitting a gate signal may be formed on the insulating substrate 10. In addition, a sustain electrode (not shown) and a sustain electrode line (not shown) extending parallel to the gate line 22 may be formed.

The gate electrode 26 is connected to the gate line 22 and protrudes from the gate line 22. The gate line 22 and the gate electrode 26 are referred to as gate wirings.

The gate wirings (22 and 26) may be formed of, for example, an aluminum (Al)-based metal, such as aluminum and an aluminum alloy, a silver (Ag)-based metal, such as silver and a silver alloy, a copper (Cu)-based metal, such as copper and a copper alloy, a molybdenum (Mo)-based metal, such as molybdenum and a molybdenum alloy, or chrome (Cr), titanium (Ti) or tantalum (Ta).

In addition, the gate wirings (22 and 26) may have a multi-film structure composed of two conductive films (not shown) with different physical characteristics. One of the two conductive films may be formed of metal with low resistivity, such as, for example, an aluminum-based metal, a silver-based metal or a copper-based metal, in order to reduce a signal delay or a voltage drop of the gate wirings (22 and 26). The other one of the conductive films may be formed of a different material, in particular, a material having superior contact characteristics with indium tin oxide (ITO) and indium zinc oxide (IZO), such as, for example, a molybdenum-based metal, chrome, titanium, or tantalum. Examples of multi-film structures include a chrome lower film and an aluminum upper film, and an aluminum lower film and a molybdenum upper film. However, the present invention is not limited thereto. The gate wirings (22 and 26) may be formed of various metals and conductors.

The gate insulating film 30 is formed on the gate wirings (22 and 26). The gate insulating film 30 increases electron mobility in the channel of the TFT and reduces leakage of current to the outside. The gate insulating film 30 may be made of, for example, silicon nitride (SiNx) or silicon oxide (SiOx).

The semiconductor layer 40, which is formed of a semiconductor such as, for example, hydrogenated amorphous silicon or polycrystalline silicon, is disposed on the gate insulating film 30. The semiconductor layer 40 may have various shapes. For example, the semiconductor layer 40 may be an island or may be formed linearly. In FIG. 2, the semiconductor layer 40 is an island formed on the gate insulating film 30.

The ohmic contact layers 55 and 56 formed of a material, such as, for example, silicide or n+ hydrogenated amorphous silicon doped with n-type impurities in high concentration, are disposed on the semiconductor layer 40. The ohmic contact layers 55 and 56 may also have various shapes. For example, the ohmic contact layers 55 and 56 may be islands or may be formed linearly. When the ohmic contact layers 55 and 56 are islands, as shown in FIG. 2, they may be disposed under the source electrode 65 and the drain electrode 66.

Data wirings (62, 65, and 66) are formed on the ohmic contact layers 55 and 56 and the gate insulating film 30. The data wirings (62, 65, and 66) include a data line 62, the source electrode 65, and the drain electrode 66. The data line 62 extends in a second direction, for example, a vertical direction, and intersects the gate line 22 to define a pixel. The source electrode 65 branches off from the data line 62 and extends onto the ohmic contact layer 55. The drain electrode 66 is formed on the ohmic contact layer 56. The drain electrode 66 is separated from and is opposite the source electrode 65, with respect to the gate electrode 26 or a channel region of the TFT.

The data wirings (62, 65 and 66) may be formed of, for example, chrome, molybdenum-based metal, or refractory metal such as tantalum and titanium. In addition, the data wirings (62, 65, and 66) may have a multi-film structure composed of a lower film (not shown), which is formed of refractory metal, and an upper film (not shown), which is formed of a material with low resistivity and is disposed on the lower film. Examples of multi-film structures include a chrome lower film and an aluminum upper film, and an aluminum lower film and a molybdenum upper film. Alternatively, the multi-film structure may be a three-film structure having, for example, molybdenum-aluminum-molybdenum films.

At least a portion of the source electrode 65 overlaps the semiconductor layer 40. In addition, the drain electrode 66 faces the source electrode 65 with respect to the gate electrode 26, and at least a portion of the drain electrode 66 overlaps the semiconductor layer 40. The ohmic contact layers 55 and 56 are arranged, respectively, between the semiconductor layer 40 and the source electrode 65 and between the semiconductor layer 40 and the drain electrode 66 in order to reduce contact resistance between them.

The passivation film 70 is formed on the data wirings (62, 65, and 66) and an exposed portion of the semiconductor layer 40. The passivation film 60 is made of an insulating film. The passivation film 70 may be formed of, for example, an inorganic material such as silicon nitride or silicon oxide, an organic material having photosensitivity and superior planarization characteristics, or a low-k insulating material formed by plasma enhanced chemical vapor deposition (PECVD), such as a-Si:C:O or a-Si:O:F. The passivation film 70 may be composed of a lower inorganic film and an upper organic film in order to protect the exposed portion of the semiconductor layer 40 while taking advantage of the superior characteristics of an organic film.

A contact hole 76 that exposes the drain electrode 66 is formed in the passivation film 70. The contact hole 76 can have any shape as long as it can expose the drain electrode 66 to make the drain electrode 66 contact the pixel electrode 82. The contact hole 76 according to the current exemplary embodiment may be completely filled with a carbon composition that includes carbon nanotubes and/or graphene that is used to form the pixel electrode 82. The carbon composition including carbon nanotubes and/or graphene will be described in detail below. The contact hole 76 may have various sidewall profiles. If the contact hole 76 has, for example, a tapered sidewall profile, that is, if it becomes gradually narrower toward the bottom (where drain electrode 66 is formed), then, when the contact hole 76 is filled with the carbon composition, no bubbles or pores are formed around the contact hole 76.

The pixel electrode 82 is formed on the passivation film 70 and is electrically connected to the drain electrode 66 by the contact hole 76 in each pixel. That is, the pixel electrode 82 is physically and electrically connected to the drain electrode 66 by the contact hole 76 and thus receives a data voltage from the drain electrode 66.

The pixel electrode 82 according to the current exemplary embodiment may be formed of a carbon composition that includes carbon nanotubes and/or graphene. More specifically, a carbon composition including carbon nanotubes and/or graphene may be coated on the passivation film 70 by a coating process. Coating processes that may be used to coat the carbon composition onto the passivation film include processes that are known to those of ordinary skill in the art, for example, spray coating, spin coating, or slit coating. After the coating process, a photolithography process may be performed on the carbon composition coated onto the passivation film 70, thereby forming the pixel electrode 82.

The carbon composition contains carbon nanotubes or graphene, or a combination of carbon nanotubes and graphene a dispersing agent, and a dispersing solvent. In general, any composition that contains carbon nanotubes and/or graphene and is capable of being coated onto the substrate and filling contact hole 76 may be used as the carbon composition. A carbon nanotube is a tube-shaped molecule created by rolling up a graphene sheet composed of connected hexagonal rings, each formed by six carbons. Graphene is a single sheet of graphite with a honeycomb lattice of carbon atoms connected in a hexagonal pattern and is a basic building block of carbon nanotubes. Examples of dispersing agents that may be used in the carbon composition include, for example, sodium dodecyl sulfate (SDS), Triton X (Sigma), Polyoxyethylene Sorbitan Monooleate (Tween20), Cetyl Trimethyl Ammonium Bromide (CTAB), polyacrylic acid, poly (ethyleneamine), poly(allylamine), poly(4-styrene sulfonic acid), polymethacrylic acid, polyphosphonate, polyacrylamide, polyvinyl acetate, polyvinylacetate, or cellulose nitrate, but not limited thereto. Examples of dispersing solvents that may be used in the carbon composition include, for example alcohol, keton, glycol, glycol ether, glycol ether acetate, acetate, water or combinations thereof, but not limited thereto.

Carbon nanotubes and graphene are less expensive than ITO or IZO but exhibits superior conductivity and transmittance. Various types of carbon nanotubes can be used, such as single-walled carbon nanotubes (SWCNTs) having a single-wall structure or multi-walled carbon nanotubes (MWCNTs) having a multi-wall structure. Carbon nanotubes can be fabricated using a method known to those of ordinary skill in the art, such as chemical deposition, arc discharge, plasma torch, or ion bombardment, incorporated herein by reference in its entirety. In addition, a pre-processing operation that can be performed using a conventional method known to those of ordinary skill in the art. However, the pre-processing operation is optional. Carbon nanotubes used herein may have an outer diameter of 1 to 100 nm and a length of 0.5 to 30 μm.

The pixel electrode 82 according to the current exemplary embodiment may completely fill the contact hole 76 such that its top surface is flat and without a hole or indentation over the contact hole 76. That is, as shown in FIG. 2, the contact hole 76 is completely filled with the carbon composition. Thus, the region of the pixel electrode 82 disposed on and over the contact hole 76 and the remaining region of the pixel electrode 82 can both be formed to an equal height without a step difference therebetween.

An alignment film (not shown) which can align liquid crystal molecules may be coated on the pixel electrode 82 and the passivation film 70.

When forming a pixel electrode that includes the carbon composition, the carbon composition for coating onto the substrate is a solution that contains a solvent, for instance, the dispersing solvent. When the coating process is performed using the carbon composition containing the solvent, the solvent is dried as part of the process. As the solvent is dried, bubbles or pores are created around any deeply recessed three-dimensional (3D) structures, such as a contact hole. The bubbles and/or pores may cause the carbon nanotubes or graphene to be partially cut, thereby increasing contact resistance. However, the TFT substrate according to the current exemplary embodiment includes the pixel electrode 82 formed by completely filling the contact hole 76 with the carbon composition such that its top surface is flat. Thus, no bubbles or pores are created around the contact hole 76 when the pixel electrode 82 is formed using a coating process with the carbon composition. Consequently, an increase in contact resistance can be prevented.

Hereinafter, a method of manufacturing a TFT substrate according to an exemplary embodiment will be described in detail with reference to FIGS. 3 through 7.

Figure 3:
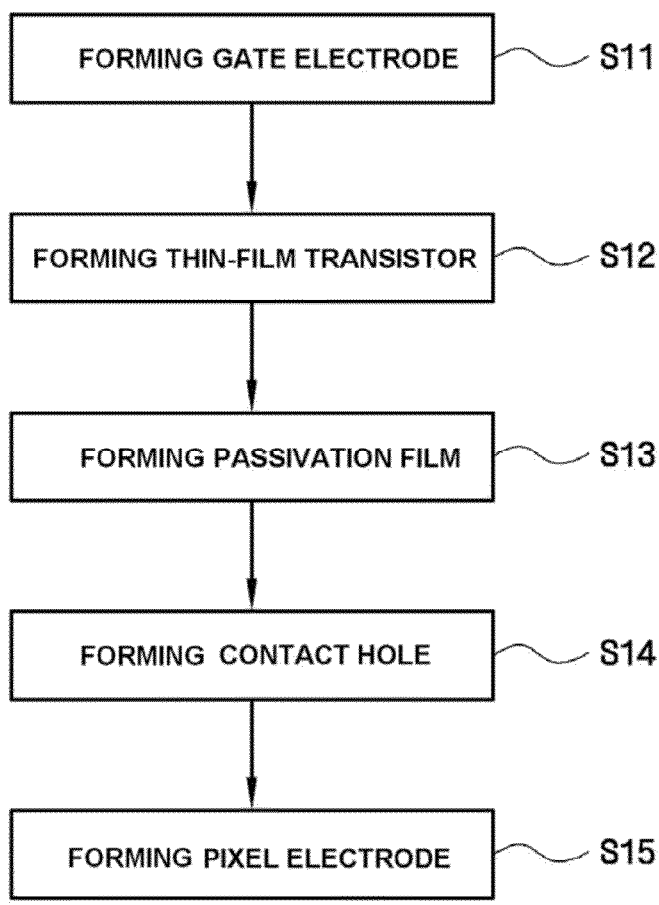
FIG. 3 is a flowchart illustrating a method of manufacturing a TFT substrate according to an exemplary embodiment.

FIG. 3 is a flowchart illustrating a method of manufacturing a TFT substrate according to an exemplary embodiment. Referring to FIG. 3, the method of manufacturing a TFT substrate according to the current exemplary embodiment includes forming a gate electrode (S11), forming a TFT (S12), forming a passivation film (S13), forming a contact hole (S14), and forming a pixel electrode (S15). In the manufacturing method according to the current exemplary embodiment, a pixel electrode is formed by filling a contact hole formed to make a drain electrode contact the pixel electrode. Thus, contact resistance can be prevented from increasing when the pixel electrode is formed using carbon nanotubes or graphene.

Figure 4:
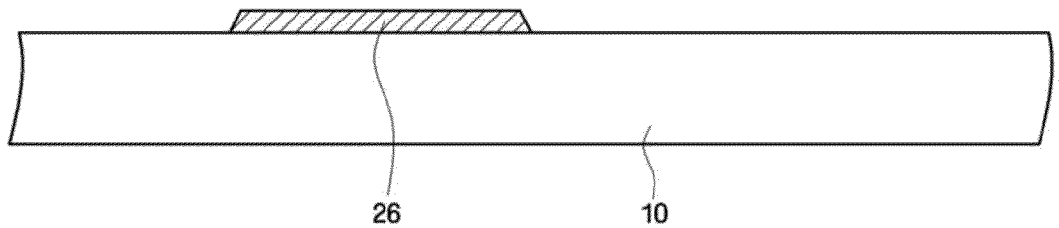
FIGS. 4 through 7 are cross-sectional views respectively illustrating processes in the method of manufacturing a TFT according to the exemplary embodiment of FIG. 3.

Referring to FIG. 4, a gate electrode 26 is formed on a substrate 10 in the forming of the gate electrode (S11).

Specifically, a metal layer is formed on the substrate 10 by, e.g., sputtering. Then, the metal layer is patterned using a photolithography process, thereby forming the gate electrode 26. The substrate 10 may be an insulating substrate made of, e.g., glass, quartz, or plastic. The metal layer may be formed of, e.g., aluminum-based metal, such as aluminum and an aluminum alloy, silver-based metal, such as silver and a silver alloy, copper-based metal such as copper and a copper alloy, molybdenum-based metal, such as molybdenum and a molybdenum alloy, chrome, titanium or tantalum.

Figure 5:
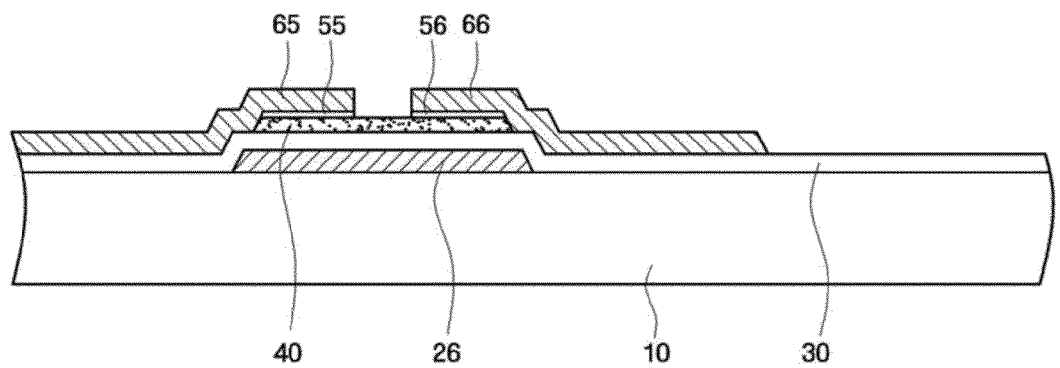

Referring to FIG. 5, a gate insulating film 30 is formed on the gate electrode 26, and a semiconductor layer 40, a source electrode 65 and a drain electrode 66 are formed on the gate insulating film 30 in the forming of the TFT (S12).

More specifically, three films, that is, the gate insulating film 30 (such as an oxide film or a nitride film), an amorphous silicon layer or a polycrystalline silicon layer, and a doped amorphous silicon layer are sequentially deposited on the gate electrode 26 by, e.g., PECVD. Then, a photolithography process is performed to form an amorphous silicon layer pattern or a polycrystalline silicon layer pattern and a doped amorphous silicon layer pattern. Next, a metal layer is formed by depositing metal on the doped amorphous silicon layer pattern using, e.g., sputtering. Then, the metal layer is patterned using a photolithography process thereby to form the source electrode 65 and the drain electrode 66. After the source electrode 65 and the drain electrode 66 are formed, exposed portions of the doped amorphous silicon layer pattern are etched. As a result, ohmic contact layers 55 and 56 separated from each other with respect to the gate electrode 26 are formed, while a portion of the semiconductor layer 40 between the ohmic contact layers 55 and 56 is exposed. An oxygen plasma process may be optionally performed in order to stabilize a surface of the exposed portion of the semiconductor layer 40.

Figure 6:
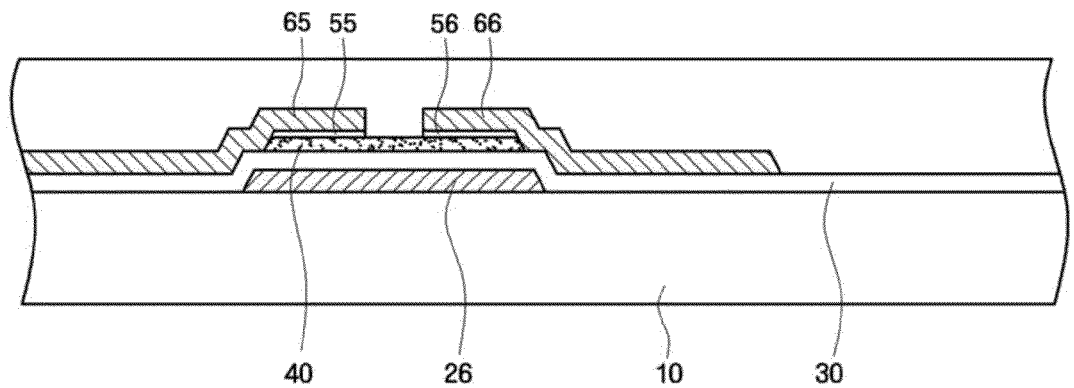

Referring to FIG. 6, an insulating film is formed on the source electrode 65, the drain electrode 66, and the semiconductor layer 40 in the forming of the passivation film (S13).

Specifically, the insulating film is formed by depositing, e.g., an inorganic material such as silicon nitride or a low-k insulating material such as a-Si:C:O or a-Si:O:F on the source electrode 65, the drain electrode 66, and the semiconductor layer 40 using PECVD. Alternatively, the insulating film is formed by coating an organic material having photosensitivity and superior planarization characteristics on the source electrode 65, the drain electrode 66, and the semiconductor layer 40.

Figure 7:
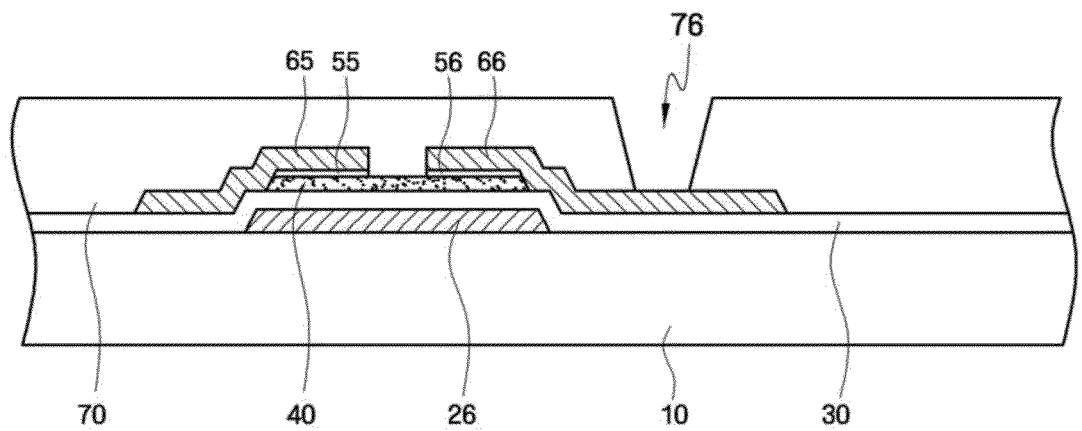

In the forming of the contact hole (operation S14), a contact hole 76 exposing a portion of the drain electrode 66 is formed in a passivation film 70 as shown in FIG. 7.

Specifically, a photoresist film is coated on the passivation film 70 and is patterned by a photolithography process, that is, the photoresist film is exposed to light by using a mask and is then developed. As a result, the contact hole 76 that exposes the specific region of the drain electrode 66 is formed in the passivation film 70.

In the forming of the pixel electrode (operation S15), a pixel electrode 82 is formed by coating the carbon composition on the passivation film 70.

Specifically, the carbon composition is coated on the passivation film 70 using a coating process such as, for example, spin coating or slit coating, and is then patterned using a photolithography process. As a result, the pixel electrode 82 that contacts the exposed portion of the drain electrode 66 through the contact hole 76 is formed. The contact hole 76 is completely filled with the carbon composition such that the pixel electrode 82 has a flat top surface without a step difference between the region of the pixel electrode 82 disposed immediately on and over the contact hole 76 and the remaining region of the pixel electrode 82. Through the above processes, a TFT substrate having a cross section as shown in FIG. 2 can be manufactured.

As described above, when used instead of ITO or IZO to form an electrode, carbon nanotubes or graphene, despite their advantages in terms of cost, conductivity, transmittance and process simplification, can increase contact resistance in a region in which a structure such as a contact hole is formed. Specifically, a process in which the carbon nanotubes and/or graphene are in solution is performed to form an electrode using carbon nanotubes or graphene. Here, as a solvent contained in the carbon composition evaporates, bubbles or pores may be formed around a recessed structure, or the structure of the carbon nanotube may be partially cut, thereby increasing contact resistance. However, as in the manufacturing method according to the current exemplary embodiment, if the pixel electrode 82 is not formed just along the tapered portion of structure of the contact hole 76, but if instead the contact hole 76 is completely filled such that the top surface of the pixel electrode 82 is flat, bubbles or pores are not formed. Consequently, contact resistance does not increase.

Hereinafter, a TFT substrate according to another exemplary embodiment will be described with reference to FIG. 8. A plan view of the TFT substrate according to the current exemplary embodiment is identical to FIG. 1. However, a cross-sectional view of the TFT substrate taken along line I-I' of FIG. 1 is as shown in FIG. 8.

Figure 8:
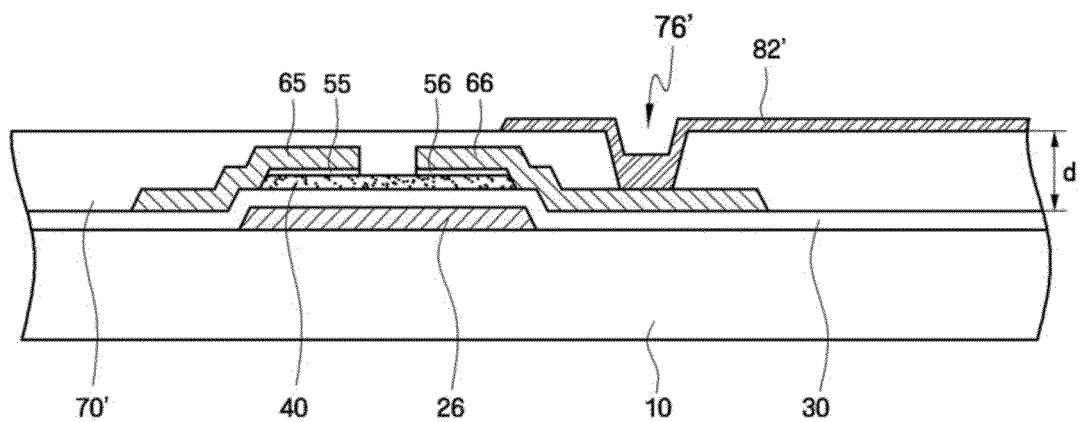
FIG. 8 is a cross-sectional view of a TFT substrate according to another exemplary embodiment.

Referring to FIG. 8, the TFT substrate according to the current exemplary embodiment includes an insulating substrate 10, a gate electrode 26, a gate insulating film 30, a semiconductor layer 40, ohmic contact layers 55 and 56, a source electrode 65, a drain electrode 66, a passivation film 70', and a pixel electrode 82'. For simplicity, elements having the same functions as those of the TFT substrate according to the previous exemplary embodiment of FIGS. 1 and 2 are indicated by like reference numerals, and thus their description will be omitted.

The TFT substrate according to the current exemplary embodiment basically has the same structure as the TFT substrate according to the previous exemplary embodiment except for the passivation film 70', a contact hole 76', and the pixel electrode 82' which will therefore be mainly described below.

The passivation film 70' is formed on data wirings (62, 65, and 66) and an exposed portion of the semiconductor layer 40 and is made of an insulating film. The passivation film 70' may be formed of, e.g., an inorganic material such as silicon nitride or silicon oxide, an organic material having photosensitivity and superior planarization characteristics, or a low-k insulating material formed by PECVD, such as a-Si:C:O or a-Si:O:F. The passivation film 70' may be composed of a lower inorganic film and an upper organic film in order to protect the exposed portion of the semiconductor layer 40 while taking advantage of the superior characteristics of an organic film.

The passivation film 70' according to the current exemplary embodiment may be formed to a thickness of 1,000 Å or less from a top surface of the gate insulating film 30.

As the thickness of the passivation film 70' increases, a depth of the contact hole 76' exposing the drain electrode 66 also increases, causing the TFT substrate to be more deeply indented. Accordingly, when the pixel electrode 82' is formed using a carbon composition that includes carbon nanotubes and/or graphene, an increased number of bubbles or pores may formed around the contact hole 76' in the process of drying a dispersing solvent. This may deteriorate the connectivity of carbon nanotubes and increase contact resistance.

Therefore, in the TFT substrate according to the current exemplary embodiment, the thickness (d) of the passivation film 70' is reduced, which decreases the depth of the contact hole 76' to suppress the creation of bubbles or pores around the contact hole 76' when the pixel electrode 82' is formed, and thus to prevent an increase in contact resistance. Here, the thickness (d) of the passivation film 70' may be 1000 Å or less, more particularly 300 to 850 Å. Specifically, when the pixel electrode 82' formed of a carbon composition has a thickness of 200 to 500 Å, the passivation film 70' may have a thickness of 500 to 1000 Å, or more particularly 500 to 850 Å. When the passivation film 70' has a thickness of 1000 Å or less, if the pixel electrode 82' is formed using the carbon composition, contact resistance around the contact hole 76' does not increase. When ITO or IZO is used to form the pixel electrode 82', the passivation film 70' should be formed to a thickness of more than 1000 Å in order to prevent the diffusion of ITO or IZO. However, when the carbon composition is used to form the pixel electrode 82', the passivation film 70' can be formed to a thickness of 1000 Å or less because the diffusion of the carbon composition does not occur.

The contact hole 76' exposing the specific region of the drain electrode 66 is formed in the passivation film 70'. The contact hole 76' can have any structure as long as it can expose the specific region of the drain electrode 66. However, the contact hole 76' may preferably have a tapered sidewall profile, that is, it may be wide at the top (where pixel electrode 82' is formed) and narrow at the bottom (where the drain electrode 66 is formed). When the sidewall profile of the contact hole 76' has a tapered structure in which the width of the contact hole 76' is reduced toward the bottom, the creation of bubbles or pores around the contact hole 76' when the pixel electrode 82' is formed can be reduced, thereby preventing an increase in contact resistance.

The pixel electrode 82' is formed on the passivation film 70' and is electrically connected to the drain electrode 66 by the contact hole 76' in each pixel. The pixel electrode 82' may be formed using the carbon composition. The carbon composition is as described above, and thus a detailed description thereof is omitted. When the pixel electrode 82' is formed using the carbon composition, a coating process can be performed in which the carbon composition is in solution, instead of a metal sputtering process. Furthermore, due to superior dry-etching characteristics of the carbon composition, dry etching, instead of wet etching, can be used in a photolithography process.

A region of the pixel electrode 82' disposed on the contact hole 76' may be formed along the tapered structure of the contact hole 76' and thus have the same structure as the contact hole 76'. That is, like the contact hole 76', a region of the pixel electrode 82' disposed immediately on the contact hole 76' may be tapered, i.e., may become narrower toward the bottom. Specifically, referring to FIG. 8, a region of the pixel electrode 82' disposed immediately on the contact hole 76' may include a tapered sidewall which becomes narrower toward the bottom, and a flat surface which is connected to the sidewall, parallel to the drain electrode 66, and formed at a height lower than the passivation film 70' from the substrate 10. Here, as shown in FIG. 8, the thickness of the pixel electrode 82' formed on a region of the drain electrode 66 which is exposed by the contact hole 76' may be thicker than the thickness of the pixel electrode 82' formed on the passivation film 70' and a sidewall of the contact hole 76'.

A conventional TFT substrate includes a thick passivation film, and thus a deep contact hole. Therefore, when a pixel electrode is formed along the deep contact hole, a region of the pixel electrode disposed immediately on the contact hole does not have a flat surface parallel to a drain electrode. Instead, a contact line is formed by contact at the ends of sidewalls of the pixel electrode. Contact line means the line that is formed by contacting both ends of tapered sidewalls of the pixel electrode in the contact hole. On the other hand, the TFT substrate according to the current exemplary embodiment includes the passivation film 70' with a reduced thickness and thus the contact hole 76' has a reduced depth. Accordingly, a region of the pixel electrode 82' disposed on the contact hole 76' has a surface parallel to the drain electrode 66, instead of having a contact line at the ends of sidewalls of the pixel electrode 82. This structure results in a reduction in the formation of bubbles or pores around the contact hole 76', thereby preventing an increase in contact resistance.

Hereinafter, a method of manufacturing a TFT substrate according to another exemplary embodiment will be described in detail with reference to FIGS. 9 through 16. A description of features identical to those of the manufacturing method according to the previous exemplary embodiment, or which can be clearly inferred or understood by those of ordinary skill in the art, are omitted or described only briefly.

Figure 9:
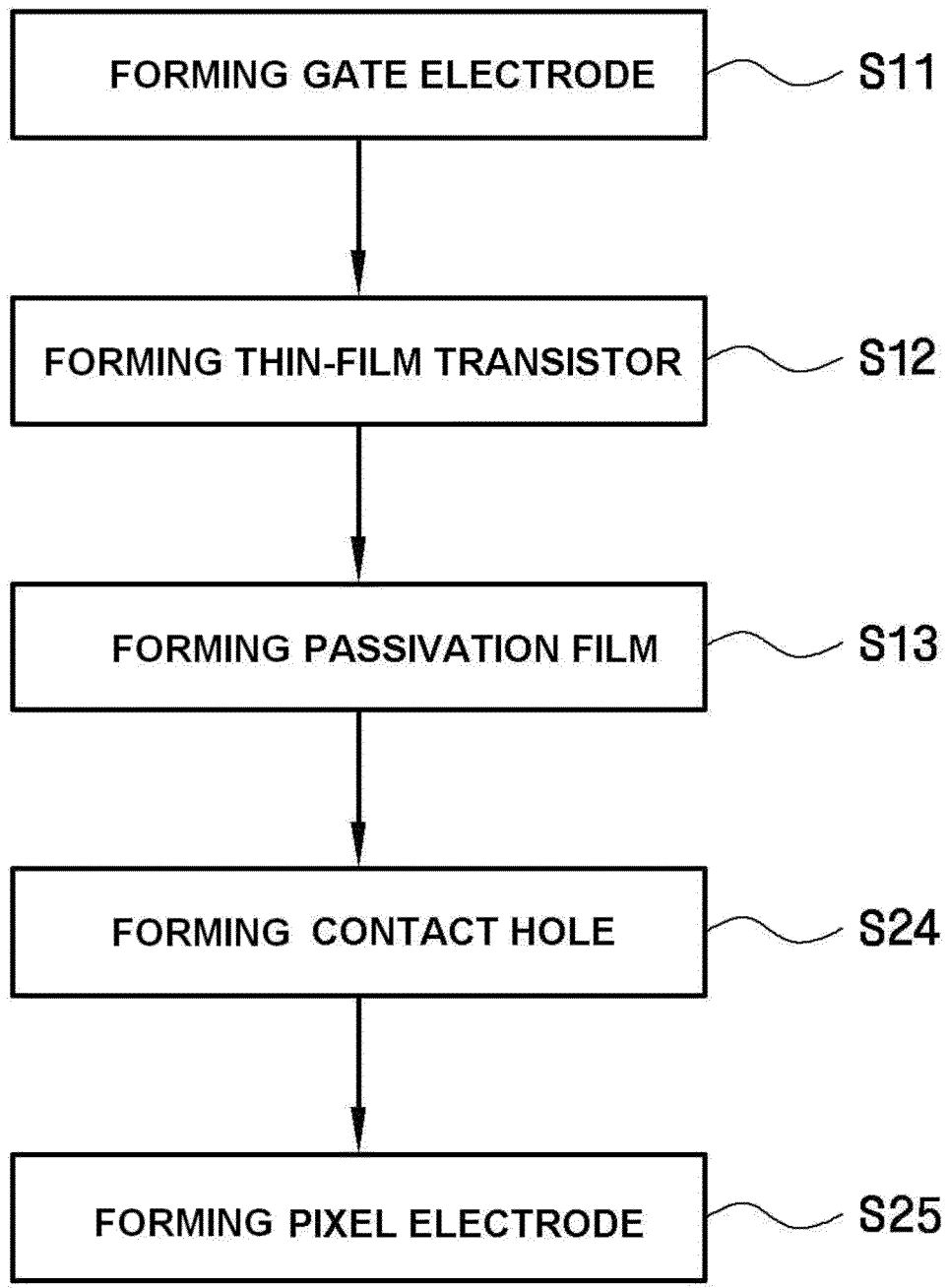
FIG. 9 is a flowchart illustrating a method of manufacturing a TFT substrate according to another exemplary embodiment

Referring to FIG. 9, the method of manufacturing a TFT substrate according to the current exemplary embodiment includes forming a gate electrode (S11), forming a TFT (S12), forming a passivation film (S13), forming a contact hole (S24) (not shown), and forming a pixel electrode (S25) (not shown). S11, S12, and S13 are identical to those of the manufacturing method according to the previous exemplary embodiment (FIG. 3) except that a passivation film 70' is formed to a thickness of 1000 Å or less in operation S13. Therefore, operations S24 and S25 will mainly be described below.

Figure 10:
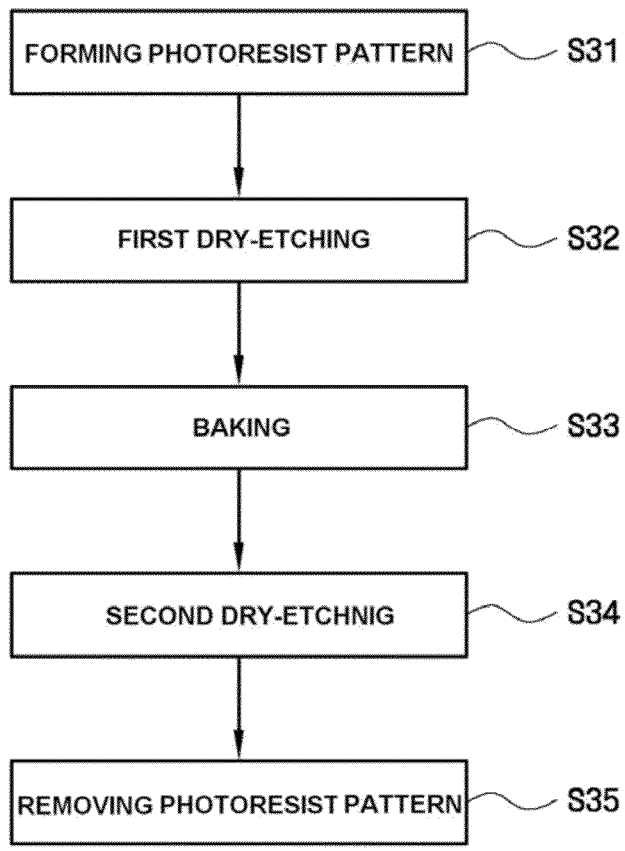
FIG. 10 is a flowchart illustrating a method of manufacturing a TFT substrate according to another exemplary embodiment.

FIG. 10 is a flowchart illustrating the forming of the contact hole (S24) in the manufacturing method according to the current exemplary embodiment of the present invention. Referring to FIG. 9, the forming of the contact hole (S24) includes forming a photosensitive pattern (S31); a first dry-etching (operation S32), a baking (S33), a second dry-etching (S34); and a removing the photoresist pattern (S35).

In the manufacturing method according to the current exemplary embodiment, a contact hole is formed by a dry-etching process. In particular, the dry-etching process is performed through three stages, so that a sidewall of the contact hole has a tapered structure, that is, becomes narrower toward the bottom (at drain electrode 66), and is prevented from being inversely tapered. The tapered sidewall of the contact hole reduces the formation of bubbles or pores when a pixel electrode is formed using the carbon composition, thereby preventing an increase in contact resistance.

Figure 11:
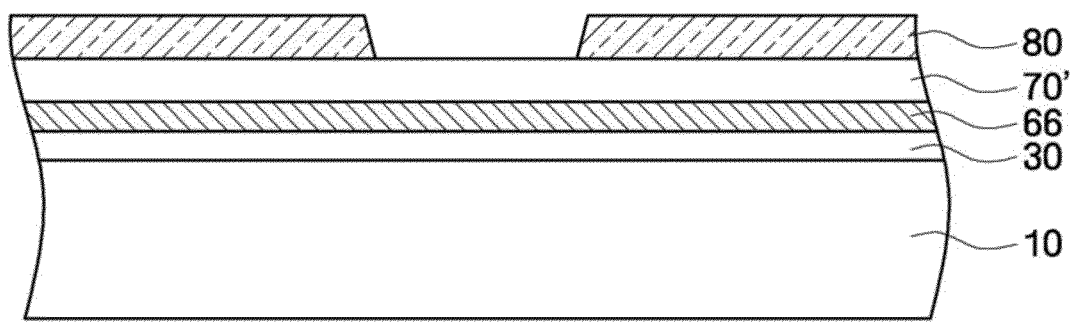
FIGS. 11 through 16 are cross-sectional views respectively illustrating processes in the method of manufacturing a TFT substrate according to the exemplary embodiment of FIG. 9.

Referring to FIG. 11, in the forming of the photoresist pattern (S31), a photoresist film is formed on the passivation film 70', which was formed in the forming of the passivation film (operation S13), and is then exposed to light and developed to form a desired photoresist pattern 80.

Here, the photoresist film may be formed to a thickness approximately 10 to 15% of a thickness of the passivation film 70' that is to be etched. Specifically, when the passivation film 70' is formed to a thickness of, e.g., 1000 Å or less, the photosensitive film may be formed to a thickness of approximately 1.5 µm or less. Because the passivation film 70' according to the current exemplary embodiment is thinner than a conventional passivation film, the photosensitive film is formed to be thinner than a conventional photosensitive film.

Figure 12:
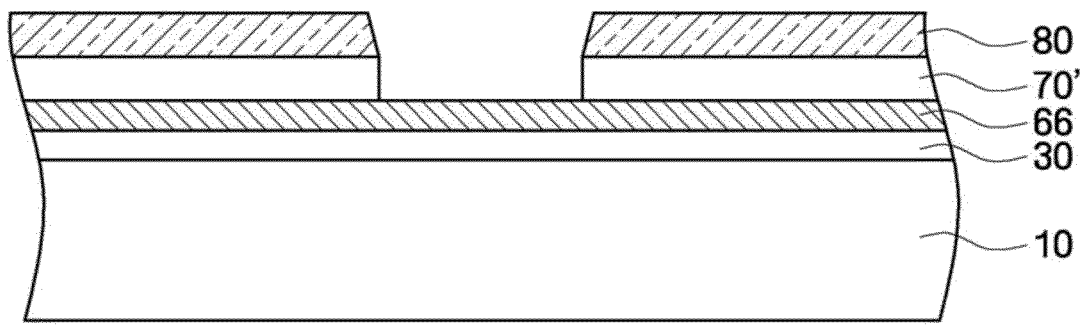

Referring to FIG. 12, the passivation film 70' is dry-etched using the photosensitive pattern 80 as an etch mask in the first dry-etching (S32).

The dry-etching process may be, for example, a plasma-etching process. The plasma-etching process may be performed using an oxygen-free gas containing a fluorine-based gas and nitrogen ($N_2$). The pressure may be approximately 200 to 500 mT. The fluorine-based gas used in the plasma-etching process may be, for example, a gas or a mixture of gases selected from the group consisting of $SF_6$, $CF_4$, $CHF_3$, and $C_2F_6$. A ratio of the fluorine-based gas to the $N_2$ gas may be 2:1 or 4:1 but may vary according to the hardness or thickness of the insulating film. Since the dry-etching process is carried out in a vacuum state, i.e., in a clean environment, there is no need to worry about, for example, waste water treatment.

Figure 13:
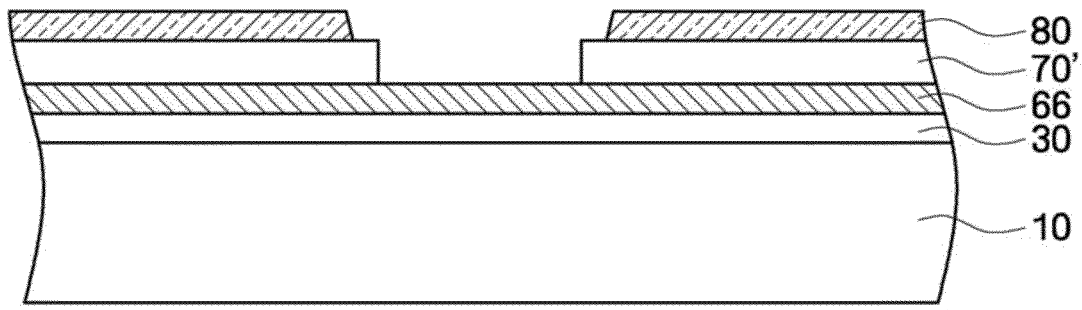

Referring to FIG. 13, in the baking (S33), the TFT substrate which has gone through up to the first dry-etching (S32) is left in the presence of a gas, described below, and at a predetermined temperature to reduce the size of the photoresist pattern 80.

Specifically, in the baking (S33), the photoresist pattern 80 is slightly etched by the gas and contracts in the baking (S33). As a result, the size of the photosensitive pattern 80 is reduced. As the photosensitive pattern 80 becomes smaller, portions of the passivation film 70' which were protected by the photosensitive film in the first dry-etching (S32) are exposed, as shown in FIG. 13. The baking process (S33) may be performed in the presence of a gas containing, for example, $SF_6$ and $O_2$ and at room temperature or at approximately 100° C., for example, baking may be performed at a temperature between of 25 to 100° C. and in the presence of an oxygen gas.

Figure 14:
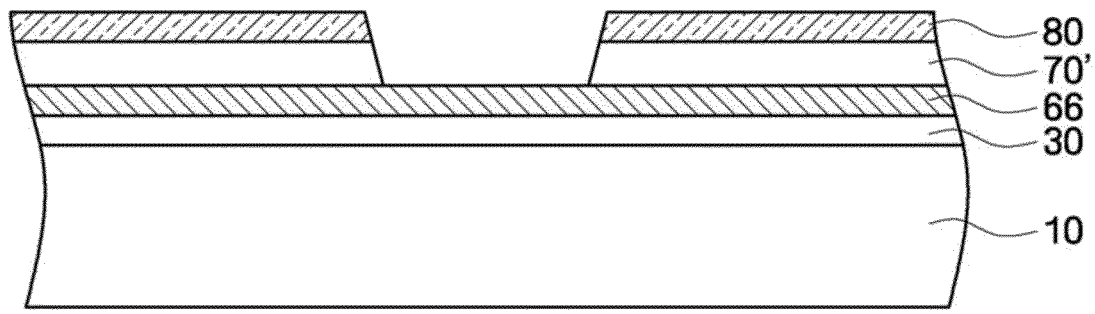

Referring to FIG. 14, in the second dry-etching (S34), the passivation film 70' is etched again using the photoresist pattern 80, which was reduced in size in the baking (S33), as an etch mask.

Specifically, in the second dry etching (S34), the portions of the passivation film 70' exposed by the photoresist pattern 80, which was reduced in size in the baking (S33), are etched in the second dry-etching (S34). As a result, the profile of a contact hole sidewall is tapered, that is, becomes narrower toward the bottom (at drain electrode 66) as shown in FIG. 14. The second dry-etching may be performed, for example, in the same way as the first dry-etching.

Figure 15:
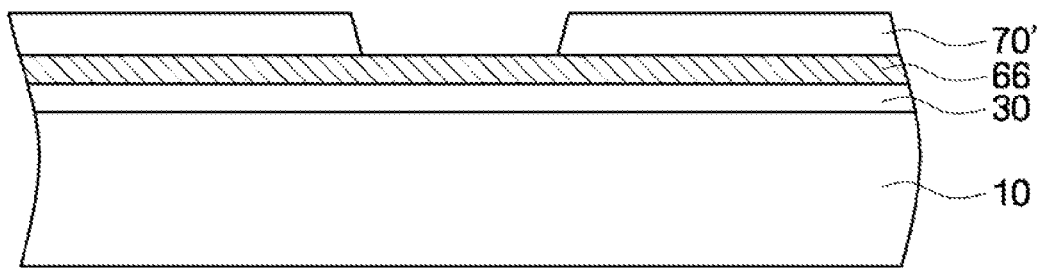

Referring to FIG. 15, the photoresist pattern 80 is removed in the removal process (S35). The photoresist pattern 80 may be removed using a conventional method known to those of ordinary skill in the art, for example, an ashing method. In the ashing method, oxygen atoms are supplied into an ashing chamber to form plasma. Accordingly, the photoresist film, which is an organic component, reacts with oxygen to be discharged in the form of gas. As a result, the photoresist film is removed.

In the forming of the contact hole (S24) as described above, the contact hole 76' is formed to have a tapered sidewall profile, i.e., having a width that is gradually reduced toward the bottom (at the drain electrode) of the contact hole 76'. Because, in this case, the passivation film 70' is thinner than a conventional passivation film, the contact hole 76' formed in the passivation film 70' is less deep (i.e., shallower).

Figure 16:
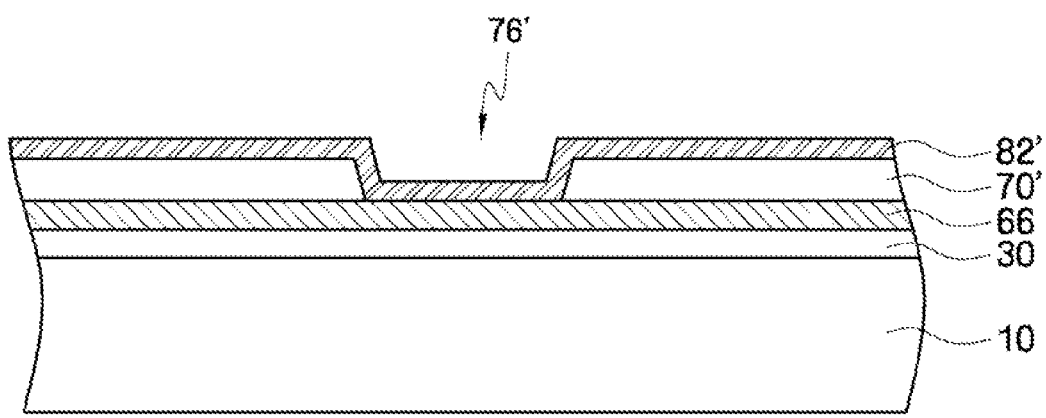

Referring to FIG. 16, a pixel electrode 82' is formed by coating the carbon composition on the passivation film 70' and the contact hole 76' in the forming of the pixel electrode (S25).

Specifically, the pixel electrode 82' may be formed by coating the carbon composition on the passivation film 70' and the contact hole 76' using an inkjet printing method. Alternatively, the passivation film 70' and the contact hole 76' may be covered with a mask, and then the pixel electrode 82' formed by coating the carbon composition on the mask using various coating methods. Alternatively, the carbon composition may be coated using a coating method known to those of ordinary skill in the art, such as, for example, spray coating, slit coating or spin coating, and is then heat-treated to form a carbon film. Thereafter, a photosensitive film is formed on a surface of the carbon film and is exposed to light, etched, and patterned to form the pixel electrode 82'. The photosensitive film may be dry-etched. The carbon composition can be any composition containing carbon nanotubes or graphene, a dispersing agent, a dispersing solvent, and the like, as are known to persons of ordinary skill in the art.

A hole similar in shape to the contact hole 76' may be formed in a region of the pixel electrode 82' disposed on the contact hole 76'. Specifically, referring to FIG. 16, a region of the pixel electrode 82' disposed on the contact hole 76' may include a recessed portion with sidewalls that cover the sidewalls of the contact hole 76' and a flat surface which is connected to the sidewall and is parallel to the drain electrode 66. In addition, the pixel electrode 82' formed on an exposed portion of the drain electrode 66 may be thicker than the pixel electrode 82' formed on the passivation film 70' and the sidewall of the contact hole 76'. In this case, when the pixel electrode 82' is formed of a carbon composition that includes carbon nanotubes and/or graphene by using a solution process, the creation of pores and bubbles around the contact hole 76' can be reduced.

Hereinafter, the embodiments will be described in greater detail by way of examples below. The following examples are intended for a detailed description of the present embodiments and do not limit the scope of the present invention.

Example 1

Observation of the Profile of a Contact Hole 1-1) A passivation film was formed of SiN to a thickness of approximately 1,000 Å. Then, a photoresist film was formed by coating a photoresist composition (AZ-EM) on the passivation film to a thickness of approximately 1.5 µm using a slot die method. The photoresist film was exposed to light using a self-manufactured optical mask. A portion of the photoresist film which was not exposed to light was washed and removed using a tetramethylammonium hydroxide (TMAH) aqueous solution, thereby obtaining a photoresist pattern. The photoresist pattern was dry-etched for approximately 80 seconds using a gas containing $SF_6$ and $N_2$. As a result, a contact hole was obtained. A sidewall profile of the contact hole was observed using focused ion beam (FIB)-scanning electron microscope (SEM). The observation results are shown in FIG. 17 for four different positions on a substrate.

1-2) A photoresist pattern was obtained in the same way as the method specified in section 1-1. Then, a passivation film was dry-etched for approximately 40 seconds, baked at 60° C. for approximately 30 seconds in the presence of $SF_6$ and $O_2$ gases, and dry-etched again for 40 seconds. As a result, a contact hole was obtained. The profile of the contact hole was observed using FIB-SEM, and the observation results are shown in FIG. 18. The sidewalls of contact hole represented in FIG. 17 and FIG. 18 correspond to the left sidewall of contact hole represented in FIG. 14.

Figure 17:
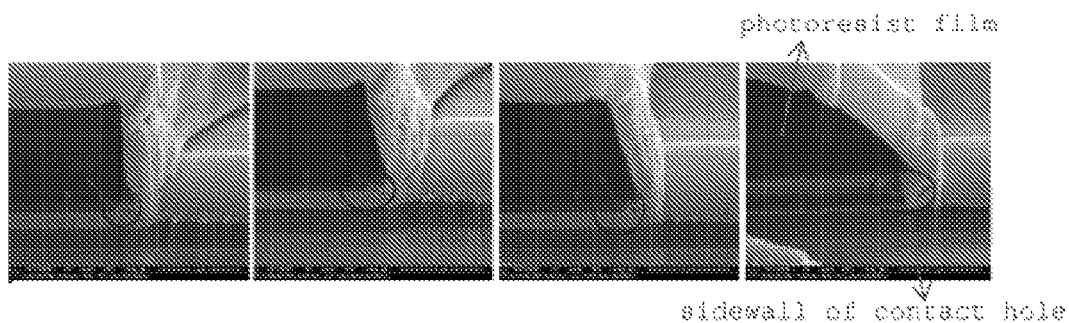
FIG. 17 shows focused ion beam (FIB)-scanning electron microscope (SEM) images of a sidewall profile of a contact hole formed using a conventional dry-etching process.
Figure 18:
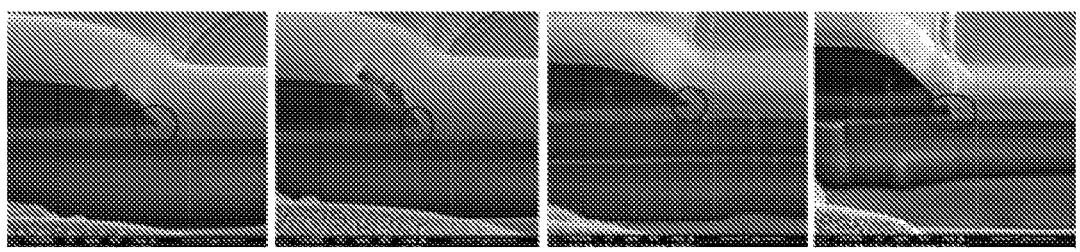
FIG. 18 shows FIB-SEM images of a sidewall profile of a contact hole formed using a dry-etching process according to an exemplary embodiment.

Referring to FIG. 17, the contact hole formed using a conventional dry-etching method has an inversely tapered sidewall profile, that is, becomes gradually wider toward the bottom. On the other hand, referring to FIG. 18, the contact hole formed according to an exemplary embodiment has a tapered sidewall profile, that is, becomes gradually narrower toward the bottom. A contact hole having a tapered sidewall profile as shown in FIG. 18 can prevent contact resistance from increasing when a pixel electrode is formed using carbon nanotubes.

Example 2

Quality Evaluation of a Liquid Crystal Display (LCD) Including a Pixel Electrode Made of a Carbon Nanotube Composition A contact hole was formed using the method specified in section 1-2 of Example 1. Then, a carbon nanotube composition was coated on an SiN passivation film and the contact hole using a process, and was then annealed for 30 minutes at 180° C., thereby forming a carbon nanotube film. Next, photoresist (AZ-EM) was coated on the carbon nanotube film using a slot die method to form a photoresist film, and the photoresist film was exposed to light using a self-manufactured optical mask. An unexposed portion of the photoresist film was washed and removed using a TMAH aqueous solution. Then, an exposed portion of the carbon nanotube film was etched using $O_2$ reactive ion etching (RIE) (80 mTorr, 800 W, an $O_2$ flow rate of 400 sccm, and 30 seconds), and the remaining portion of the photoresist film was washed using the TMAH aqueous solution to obtain a patterned pixel electrode. The carbon nanotube composition was prepared using 15 mg of single-walled carbon nanotubes (Hanwha Nanotech, ASP-100F), 15 mg of polyacrylic acid, and 30 ml of water. An image displayed on an LCD which includes a TFT substrate having this pixel electrode is shown in (a) of FIG. 19.

Figure 19:
FIG. 19 shows a photograph of an image displayed on a liquid crystal display (LCD) including a TFT substrate according to an exemplary embodiment.

On the other hand, an image displayed on an LCD which includes a pixel electrode made of ITO instead of the carbon nanotube composition is shown in (b) of FIG. 19.

Referring to FIG. 19, the LCD including the pixel electrode made of the carbon nanotube composition displays a clearer image than the LCD including the pixel electrode made of ITO.

As described above, in a TFT substrate and a method of manufacturing the same, even when a pixel electrode is formed using carbon nanotubes or graphene, contact resistance does not increase. Thus, carbon nanotubes can be used to form the pixel electrode.

Exemplary embodiments provide at least one of the following advantages.

In a method of manufacturing a TFT substrate according to an exemplary embodiment, a pixel electrode is formed using carbon nanotubes or graphene. Nonetheless, a TFT substrate whose contact resistance does not increase can be manufactured.

A method of manufacturing a TFT substrate according to an exemplary embodiment does not use methods such as sputtering and wet-etching to form an electrode. This reduces cost, simplifies the entire manufacturing process, and eliminates the need for the post-treatment of waste water generated during wet-etching.

Although a TFT substrate according to an exemplary embodiment includes an electrode formed of carbon nanotubes or graphene, contact resistance around a contact hole does not increase. In addition, the TFT substrate exhibits superior conductivity and transmittance.

However, the effects of the present disclosure and embodiments are not restricted to the one set forth herein.

While the present invention has been particularly shown and described with reference to exemplary embodiments thereof, it will be understood by those of ordinary skill in the art that various changes in form and detail may be made therein without departing from the spirit and scope of the present disclosure including the following claims. The exemplary embodiments should be considered in a descriptive sense only and not for purposes of limitation.

What is claimed is:

1. A thin-film transistor (TFT) substrate comprising:
an insulating substrate;
a passivation film formed on the insulating substrate and having a contact hole which exposes a portion of a drain electrode; and
a pixel electrode connected to the drain electrode by the contact hole and formed of a carbon composition comprising at least one of carbon nanotubes and graphene on the passivation film,
wherein the contact hole is completely filled with the carbon composition, and wherein the drain electrode includes at least one of chrome, molybdenum-based metal, and refractory metal.

2. The TFT substrate of claim 1, wherein the contact hole has a tapered sidewall profile in which a width of the contact hole is reduced toward the drain electrode.

3. The TFT substrate of claim 1, wherein the pixel electrode is formed by coating the carbon composition on the passivation film using a coating process.

4. A TFT substrate comprising:
an insulating substrate;
a passivation film formed on the insulating substrate and having a contact hole which exposes a portion of a drain electrode; and
a pixel electrode connected to the drain electrode by the contact hole and formed of a carbon composition comprising at least one of carbon nanotubes and graphene on the passivation film,
wherein the passivation film has a thickness of 1000 Å or less.

5. The TFT substrate of claim 4, wherein the contact hole has a tapered sidewall profile in which a width of the contact hole is reduced toward the drain electrode.

6. The TFT substrate of claim 4, wherein a first portion of the pixel electrode formed on the exposed portion of the drain electrode is thicker than a second portion of the pixel electrode formed on the passivation film and a sidewall of the contact hole.

7. The TFT substrate of claim 4, wherein a region of the pixel electrode disposed on the contact hole comprises:
a sidewall which covers a sidewall of the contact hole; and
a flat surface which is connected to the sidewall, is parallel to the exposed portion of the drain electrode, and is formed at a lower height than the passivation film from the insulating substrate.

8. The TFT substrate of claim 4, wherein the pixel electrode has a thickness of 200 to 500 Å, and the passivation film has a thickness of 500 to 1000 Å.

9. A method of manufacturing a TFT substrate, the method comprising:

forming a passivation film by forming an insulating film on a substrate;

forming a contact hole which exposes a portion of a drain electrode by patterning the passivation film; and forming a pixel electrode of a carbon composition comprising at least one of carbon nanotubes and graphene on the passivation film while completely filling the contact hole with the carbon composition, and wherein the drain electrode includes at least one of chrome, molybdenum-based metal, and refractory metal.

10. The method of claim 9, wherein the pixel electrode is formed by coating the carbon composition on the passivation film using a coating process.

11. A method of manufacturing a TFT substrate, the method comprising:

forming a passivation film by forming an insulating film on a substrate;

forming a photoresist pattern by forming a photoresist film on the passivation film, exposing the photoresist film to light, and developing the photoresist film;

performing a first dry-etching by dry-etching the passivation film using the photoresist pattern as an etch mask;

performing a baking to reduce a size of the photoresist pattern by leaving the substrate at a predetermined temperature in the presence of a gas after the performing of the first dry-etching;

performing a second dry-etching to form a contact hole by dry-etching the passivation film again using the photoresist pattern as a mask after the performing of the baking;

removing the photoresist pattern after the performing of the second dry-etching; and forming a pixel electrode of a carbon composition comprising at least one of carbon nanotubes and graphene on a top surface of the passivation film to completely fill the contact hole, wherein the passivation film is formed to a thickness of 1000 Å or less.

12. The method of claim 11, wherein the photoresist film is formed to a thickness of 1.5 µm or less.

13. The method of claim 11, wherein the baking is performed at a temperature of 25 to 100° C. and in the presence of an oxygen gas.

14. The method of claim 11, wherein the contact hole has a tapered sidewall profile in which a width of the contact hole is reduced toward the drain electrode.

15. The method of claim 11, wherein the pixel electrode is formed by coating the carbon composition on the passivation film using a coating process.

* * * * *